United States Patent
Gunjishima et al.

(10) Patent No.: US 9,534,317 B2
(45) Date of Patent: Jan. 3, 2017

(54) SEED CRYSTAL FOR SIC SINGLE-CRYSTAL GROWTH, SIC SINGLE CRYSTAL, AND METHOD OF MANUFACTURING THE SIC SINGLE CRYSTAL

(71) Applicants: KABUSHIKI KAISHA TOYOTA CHUO KENKYUSHO, Nagakute-shi, Aichi-ken (JP); DENSO CORPORATION, Kariya-shi, Aichi-ken (JP); SHOWA DENKO K.K., Tokyo (JP)

(72) Inventors: Itaru Gunjishima, Nagakute (JP); Keisuke Shigetoh, Nagoya (JP); Yasushi Urakami, Miyoshi (JP); Akihiro Matsuse, Hikone (JP)

(73) Assignees: KABUSHIKI KAISHA TOYOTA CHUO KENKYUSHO, Nagakute-shi (JP); DENSO CORPORATION, Kariya-shi (JP); SHOWA DENKO K.K., Tokyo (JP)

( * ) Notice: Subject to any disclaimer, the term of this patent is extended or adjusted under 35 U.S.C. 154(b) by 2 days.

(21) Appl. No.: 14/435,335

(22) PCT Filed: Oct. 29, 2013

(86) PCT No.: PCT/JP2013/006389
§ 371 (c)(1),
(2) Date: Apr. 13, 2015

(87) PCT Pub. No.: WO2014/076893
PCT Pub. Date: May 22, 2014

(65) Prior Publication Data
US 2015/0275397 A1 Oct. 1, 2015

(30) Foreign Application Priority Data
Nov. 19, 2012 (JP) .................................. 2012-253765

(51) Int. Cl.
*B32B 3/00* (2006.01)
*C30B 29/36* (2006.01)
(Continued)

(52) U.S. Cl.
CPC ............... *C30B 29/36* (2013.01); *C30B 19/12* (2013.01); *C30B 23/025* (2013.01); *C30B 25/20* (2013.01);
(Continued)

(58) Field of Classification Search
CPC ........ C30B 29/36; C30B 19/12; C30B 23/025; C30B 25/20; C30B 25/186; C30B 9/00; Y10T 428/21
See application file for complete search history.

(56) References Cited

U.S. PATENT DOCUMENTS 5,944,890 A * 8/1999 Kitou ...................... C30B 23/00
117/101
7,135,074 B2 11/2006 Gunjishima et al.
(Continued)

FOREIGN PATENT DOCUMENTS

DE 10 2010 029 755 A1 12/2011
JP H10-45499 A 2/1998
(Continued)

OTHER PUBLICATIONS

Dec. 11, 2015 Office Action issued in Swedish Patent Application No. 1351437-7.
(Continued)

*Primary Examiner* — Elizabeth Mulvaney
(74) *Attorney, Agent, or Firm* — Oliff PLC

(57) ABSTRACT

A seed crystal for SiC single-crystal growth includes a facet formation region containing a {0001}-plane uppermost portion and n (n>=3) planes provided enclosing the periphery of the facet formation region. The seed crystal for SiC single-
(Continued)

crystal growth satisfies the relationships represented by formula (a): $B^k_{k-1} \leq \cos^{-1}(\sin(2.3 \text{ degrees})/\sin C_k)$, formula (b): $B^k_k \leq \cos^{-1}(\sin(2.3 \text{ degrees})/\sin C_k)$, and formula (c): $\min(C_k) \leq 20$ degrees. In the formulas, $C_k$ is an offset angle of a k-th plane, $B^k_{k-1}$ is an angle defined by an offset downstream direction of the k-th plane and a (k−1)-th ridge line, and $B^k_k$ is an angle defined by the offset downstream direction of the k-th plane and a k-th ridge line.

10 Claims, 5 Drawing Sheets

(51) Int. Cl.
| | | |
|---|---|---|
| *C30B 23/02* | (2006.01) | |
| *C30B 19/12* | (2006.01) | |
| *C30B 25/20* | (2006.01) | |
| *C30B 9/00* | (2006.01) | |
| *C30B 25/18* | (2006.01) | |

(52) U.S. Cl.
CPC ............... *C30B 9/00* (2013.01); *C30B 25/186* (2013.01); *Y10T 428/21* (2015.01)

(56) References Cited

U.S. PATENT DOCUMENTS

| | | |
|---|---|---|
| 2005/0211156 A1 | 9/2005 | Gunjishima et al. |
| 2011/0006309 A1 | 1/2011 | Momose et al. |
| 2011/0024766 A1 | 2/2011 | Jenny et al. |
| 2012/0060751 A1* | 3/2012 | Urakami ............ C30B 23/00 117/106 |
| 2014/0027787 A1 | 1/2014 | Gunjishima et al. |

FOREIGN PATENT DOCUMENTS

| | | |
|---|---|---|
| JP | 2003-119097 A | 4/2003 |
| JP | 2004-323348 A | 11/2004 |
| JP | 2006-225232 A | 8/2006 |
| JP | 2010-235390 A | 10/2010 |
| JP | 2012-046377 A | 3/2012 |
| JP | 2012-072034 A | 4/2012 |
| JP | 2012-116676 A | 6/2012 |
| WO | 2012/157654 A1 | 11/2012 |

OTHER PUBLICATIONS

Jul. 27, 2015 Office Action issued in Korean Patent Application No. 10-2013-7033382.
Wang, S. et al., "X-Ray Topographic Studies of Defects in PVT 6H-SiC Substrates and Epitaxial 6H-SiC Thin Films." Mat. Res. Symp. Proc. 1994, pp. 735-740, vol. 339.
Kamata, I. et al., "Characterization of Basal Plane Dislocations in 4H-SiC Substrates by Topography Analysis of Threading Edge Dislocations in Epilayers." Materials Science Forum. 2010, pp. 303-306, vols. 645-648.
Kallinger, B. et al., "Dislocation Conversion and Propagation during Homoepitaxial Growth of 4H-SiC." ICSCRM2009 Technical Digest Tu-2A-2.
Stahlbush, R.E. et al., "A Pictorial Tracking of Basal Plane Dislocations in SiC Epitaxy." Materials Science Forum. 2010, pp. 271-276, vols. 645-648.
Nakamura, D. et al., "Topographic study of dislocation structure in hexagonal SiC single crystals with low dislocation density." Journal of Crystal Growth. 2007, pp. 57-63, vol. 304.
Jul. 31, 2012 International Search Report issued in PCT Application No. PCT/JP2012/062448.
Aug. 26, 2014 Office Action issued in Japanese Application No. 2011-109773.
Nov. 28, 2013 International Preliminary Report on Patentability issued in PCT Application No. PCT/JP2012/062448.
E. K. Sanchez, et al., "Nucleation of threading dislocations in sublimation grown silicon carbide," Journal of Applied Physics, vol. 91, No. 3, (2002), pp. 1143-1148.
Apr. 30, 2015 Office Action issued in Swedish Patent Application No. 1351437-7.
May 12, 2015 Office Action issued in Japanese Application No. 2011-109733.
Jan. 22, 2015 Office Action issued in Korean Application No. 10-2013-7033382.
Jan. 15, 2014 International Written Opinion issued in International Patent Application No. PCT/JP2013/006389.
Jan. 15, 2014 International Search Report issued in International Patent Application No. PCT/JP2013/006389.
Jul. 17, 2015 Office Action issued in Chinese Application No. 201280023709.2.

* cited by examiner

SEED CRYSTAL FOR SIC SINGLE-CRYSTAL GROWTH, SIC SINGLE CRYSTAL, AND METHOD OF MANUFACTURING THE SIC SINGLE CRYSTAL

TECHNICAL FIELD

The present invention relates to a seed crystal for SiC single-crystal growth, a SiC single crystal, and a method of manufacturing the SiC single crystal. In particular, the invention relates to a seed crystal for SiC single-crystal growth, which allows a shape of an initial facet formation region on a growth plane to be easily controlled, an SiC single crystal manufactured using the seed crystal, and a method of manufacturing the SiC single crystal.

BACKGROUND ART

The SiC single crystal is now drawing attention as a material for power semiconductor application, and a higher-quality substrate is required for practical use of the SiC single crystal.

A high quality crystal, i.e., a crystal having few dislocations, must be used as a seed crystal in order to produce a high-quality grown crystal. However, when quality of the seed crystal is improved, and when density of screw dislocations is particularly decreased thereby, step supply sources, which are necessary for inheriting the polytype of the seed crystal, are decreased. Consequently, heterogeneous polytypes are disadvantageously readily formed. In a proposed technique as described in Patent Literature 1, a screw dislocation formation region is provided in part of a surface of the seed crystal, and crystal growth is performed such that a {0001}-plane (c-plane) facet is superimposed on the screw dislocation formation region. This enables growth of a single crystal while suppressing formation of the heterogeneous polytypes.

Unfortunately, an SiC single crystal having a larger diameter is recently demanded, and the diameter of a grown crystal has been accordingly increased. Along with this, it has been clarified that the heterogeneous polytypes may not be stably suppressed by the above-described technique.

Through many experiments, we have discovered that formation of the heterogeneous polytypes is deeply related not only to the superimposition of the c-plane facet over the screw dislocation formation region as considered in the past, but also to the shape or size of the c-plane facet in an initial stage of crystal growth as a more important factor. In particular, the following is now clarified. That is, as the seed crystal has a larger diameter, the c-plane facet in the initial stage of crystal growth may have a more unstable shape such as an elongated linear shape rather than a stable small-circle-shape as in the process of crystal growth, and the heterogeneous polytypes are readily formed due to such an unstable shape.

As a reason why the heterogeneous polytypes are readily formed due to the elongated c-plane facet, step supply from a screw dislocation on the c-plane facet is possibly not sufficiently distributed over the entire c-plane facet. Hence, a screw dislocation formation region, which allows screw dislocations to be densely formed over the entire formation region of the c-plane facet, must be formed. This causes degradation in quality of the crystal as a whole. Moreover, the c-plane facet is likely to be separated by slight fluctuation of temperature of a growth plane or slight fluctuation of sublimated gas concentration on the growth plane. This leads to formation of a region, in which collision between steps occurs, in a growth plane other than the facet. In such a case, the heterogeneous polytypes are readily formed from a low-quality portion caused by the collision between steps.

As well known, the c-plane facet is formed in the neighborhood of a {0001} plane that is located on crystallographically higher position than its periphery in a crystal surface. It is therefore clear that the c-plane facet in the initial stage of crystal growth is affected by surface morphology of the seed crystal.

Various proposals have been made on the surface morphology of the seed crystal in the past.

For example, Patent Literature 2 discloses a technique where a conical seed crystal, of which the central axis direction is within plus or minus 10 degrees from the <0001> direction and the vertical angle is 20 to 90 degrees, is used in order to reduce micropipes and screw dislocations in a grown crystal.

Although such a pointed seed crystal must have a height of about 100 mm for a seed crystal having a diameter of 6 inches (152.4 mm), such a crystal is less likely to be produced. In the seed crystal having such a level difference, it may be difficult to adjust a growth rate of each of portions near the top and the bottom of the seed crystal, resulting in sublimation of the top during crystal growth, and consequently the shape of the seed crystal may not be maintained. If the shape of the seed crystal is maintained, the seed crystal having such a shape enables a dotted c-plane facet to be formed on the apex of the seed crystal in an initial state of crystal growth. Unfortunately, since the growth direction is similar to an a-axis direction particularly in the initial state of crystal growth, a growth region has no screw dislocation or has an extremely small density of screw dislocations as mentioned as an advantageous effect in Patent Literature 2. As a result, screw dislocations in the c-plane facet formed in the initial state of crystal growth are exhausted, resulting in formation of heterogeneous polytypes.

Patent Literature 3 discloses a technique where crystal growth is repeatedly performed with a growth plane provided with an offset angle of 20 degrees or more from a {0001} plane.

In Patent Literature 3, the offset angle of the growth plane is large, i.e., at least 20 degrees; hence, a screw dislocation contained in a seed crystal is easily converted into a dislocation in a basal plane. As a result, screw dislocations in the c-plane facet formed in the initial state of crystal growth are also exhausted, resulting in formation of heterogeneous polytypes. Moreover, Patent Literature 3 exclusively shows an Example where a {0001}-plane uppermost portion is formed by two inclined planes or one inclined plane and a side face. In this case, the most-upstream portion of the offset direction has a linear shape (corresponding to an intersection line between the inclined planes or an intersection line between the inclined plane and the side face), and a c-plane facet also has a linear shape. As a result, the c-plane facet shape easily becomes unstable, and thus heterogeneous polytypes are likely to be formed.

Patent Literature 1 describes a technique where one or a plurality of inclined planes is/are provided on a surface of a seed crystal to control a formation position of a c-plane facet.

In the technique described in Patent Literature 1, an offset angle of a growth plane is relatively small at the most-upstream portion of the offset direction on which the c-plane facet is formed, and thus a screw dislocation is allowed to exist. Patent Literature 1 further describes that a plurality of inclined planes having different inclination angles or inclination directions are provided to form a corner in the upstream portion of the offset direction, so that a c-plane facet position is controlled in the process of crystal growth.

However, as described in Patent Literature 1, even if a dotted {0001}-plane uppermost portion is formed by the plurality of planes to control the formation position of the c-plane facet, heterogeneous polytypes are more likely to be formed with an increase in diameter of the seed crystal. After the crystal growth, the grown crystal has been sliced to investigate formation of the c-plane facet in the initial stage of crystal growth. As a result, it is found that the c-plane facet is formed not only on the {0001}-plane uppermost portion but also on a ridge line between the planes. Consequently, the shape of the c-plane facet cannot be sufficiently controlled only by forming the dotted {0001}-plane uppermost portion by the plurality of planes.

Patent Literature 4 proposes a technique where a seed crystal, in which the shape of a growth plane is processed such that an offset angle of the growth plane is decreased along a direction from a {0001}-plane lower portion to a {0001}-plane uppermost portion on the growth plane, is used to prevent a dislocation flow from an offset upstream portion into an offset downstream portion.

However, even if the technique described in Patent Literature 4 is used, heterogeneous polytypes may be formed. A grown crystal having the heterogeneous polytypes has been sliced to investigate the shape of the c-plane facet in the initial stage of crystal growth. As a result, it is found that the c-plane facet having an unstable shape (a linear shape) is formed. Consequently, it is considered that the shape of the c-plane facet formed in the initial stage of crystal growth cannot be sufficiently controlled only by decreasing the offset angle at the offset upstream portion as described in Patent Literature 4.

CITATION LIST

Patent Literature

PTL 1: Patent Literature 1: Japanese Unexamined Patent Application Publication No. 2004-323348.
PTL 2: Patent Literature 2: Japanese Unexamined Patent Application Publication No. H10-045499.
PTL 3: Patent Literature 3: Japanese Unexamined Patent Application Publication No. 2006-225232.
PTL 4: Patent Literature 4: Japanese Unexamined Patent Application Publication No. 2012-046377.

SUMMARY OF INVENTION

Technical Problem

A problem that the invention is to solve is to provide a seed crystal for SiC single-crystal growth, the seed crystal used for c-plane growth of an SiC single crystal and capable of suppressing formation of a linear c-plane facet in an initial stage of crystal growth so as to allow formation of a dotted or small-circle-shaped c-plane facet, and stably holding a screw dislocation within a formation region of such a c-plane facet. Moreover, the problem is to provide an SiC single crystal manufactured using the seed crystal and a method of manufacturing the SiC single crystal.

Another problem that the invention is to solve is to provide a seed crystal for SiC single-crystal growth capable of suppressing formation of a linear c-plane facet in an initial stage of crystal growth even if an SiC single crystal having a large diameter is grown in a c-plane growth manner. Moreover, the problem is to provide an SiC single crystal manufactured using the seed crystal and a method of manufacturing the SiC single crystal.

Still another problem that the invention is to solve is to provide a seed crystal for SiC single-crystal growth capable of suppressing formation of a linear c-plane facet in an initial stage of crystal growth without increasing the thickness of the seed crystal or without reducing a proportion of a high-quality region in a grown crystal as a whole. Moreover, the problem is to provide an SiC single crystal manufactured using the seed crystal and a method of manufacturing the SiC single crystal.

Solution to Problem

To solve the above-described problems, a seed crystal for SiC single-crystal growth according to the present invention is summarized by having the following configuration.

(1) The seed crystal for SiC single-crystal growth includes
a facet formation region containing a {0001}-plane uppermost portion, and
n (n>=3) planes provided enclosing the periphery of the facet formation region.

(2) The facet formation region includes a region ranging from the center of gravity of the {0001}-plane uppermost portion to any point corresponding to a radius r being R/5 (R is a diameter of a circumscribed circle of the seed crystal for SiC single-crystal growth).

(3) The seed crystal for SiC single-crystal growth satisfies the relationships represented by formulas (a) to (c):

$$B^k_{k-1} <= \cos^-(\sin(2.3 \text{ degrees})/\sin C_k) \qquad (a);$$

$$B^k_k <= \cos^-(\sin(2.3 \text{ degrees})/\sin C_k) \qquad (b); \text{ and}$$

$$\min(C_k) <= 20 \text{ degrees} \qquad (c),$$

where $C_k$ is an offset angle of a k-th plane,
$B^k_{k-1}$ is an angle defined by an offset downstream direction of the k-th plane and a (k−1)-th ridge line, and
$B^k_k$ is an angle defined by the offset downstream direction of the k-th plane and a k-th ridge line.

A method of manufacturing an SiC single crystal according to the present invention includes a growth step of growing an SiC single crystal on a growth plane of the seed crystal for SiC single-crystal growth according to the invention.

Furthermore, the SiC single crystal according to the invention is summarized in that a maximum dimension (d) of a {0001}-plane facet in an initial stage of crystal growth (at a position slightly inside a grown crystal from an interface between the seed crystal for SiC single-crystal growth and a grown crystal) is ⅕ or less of a diameter (D) of the grown crystal in the initial stage of crystal growth, and the diameter (D) is 4 inches (101.6 mm) or more.

Advantageous Effects of Invention

In the case where the growth plane of the seed crystal is configured of n planes, and when the angle defined by a ridge line (an intersection line between adjacent planes) and the {0001} plane is less than 2.3 degrees, a linear c-plane facet is likely to be formed on the ridge line in the initial stage of crystal growth.

In contrast, when the shape of each plane is optimized such that the formulas (a) to (c) are satisfied, all angles defined by the ridge lines and the {0001} plane can be made 2.3 degrees or more. As a result, formation of the linear c-plane facet can be suppressed in the initial stage of crystal growth.

Moreover, as long as the formulas (a) to (c) are satisfied, all or some of the offset angles $C_k$ (k=1, 2, ..., n) of k-th planes can be each decreased. As a result, even if the seed crystal has a large diameter, the thickness of the seed crystal may not be increased more than necessary.

Furthermore, as long as the formulas (a) to (c) are satisfied, the area of the k-th plane (i.e., $B^k_{k-1}$ and $B^k_k$) can be increased. Consequently, a high-quality single crystal can be grown on a k-th plane having large area.

DESCRIPTION OF EMBODIMENTS

An embodiment of the present invention will now be described in detail.

1. DEFINITION OF TERM

Figure 1:
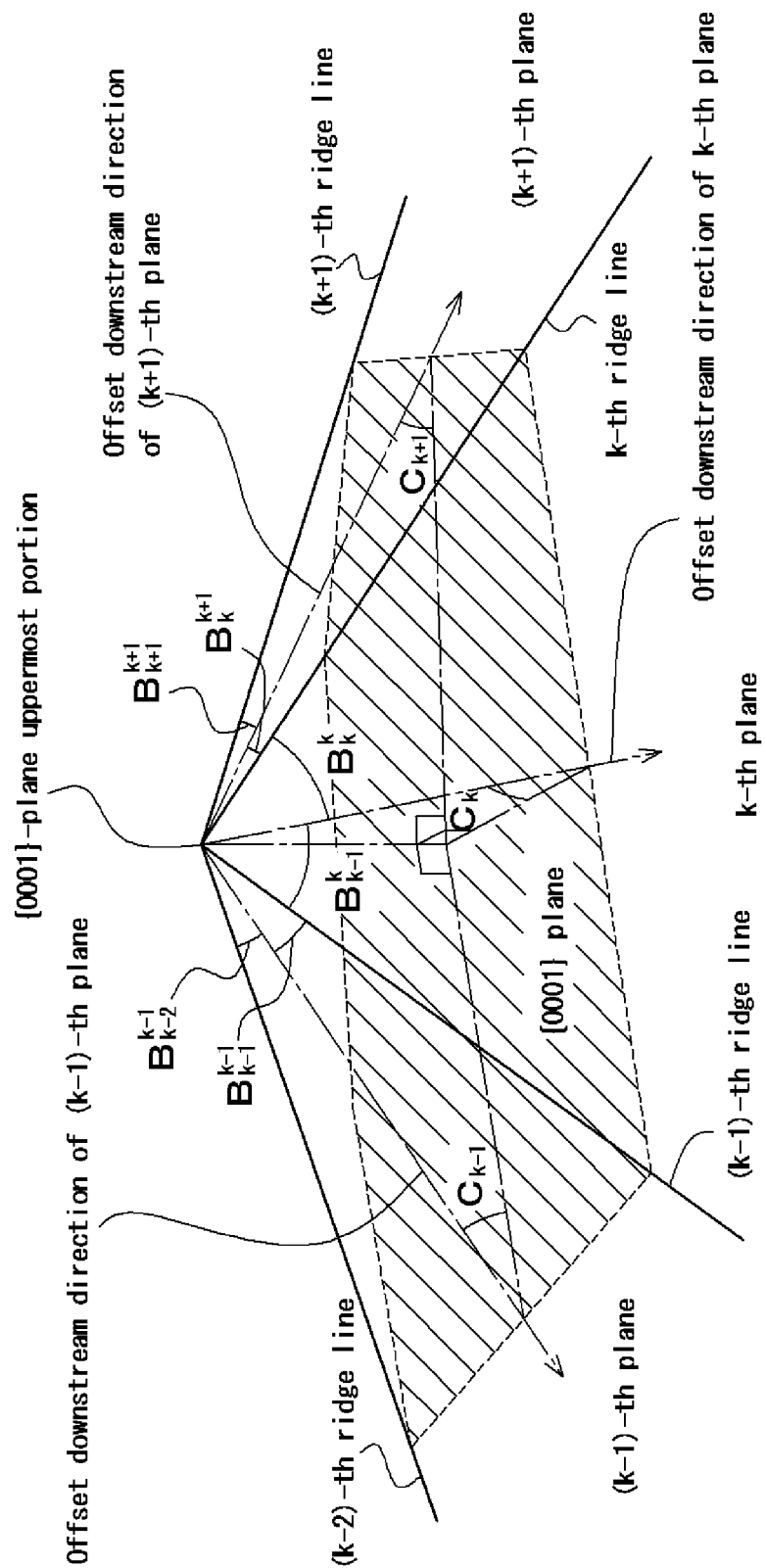
FIG. 1 is a schematic diagram of a seed crystal for explaining the definition of each of terms.

FIG. 1 illustrates a schematic diagram of a seed crystal for explaining the definition of each of terms.

A term {0001}-plane uppermost portion refers to a {0001} plane at the highest position of the seed crystal.

For example, in the case where the seed crystal has a pyramid shape as illustrated in FIG. 1, {0001}-plane uppermost portion refers to an apex of the pyramid.

Although not shown, in the case where the seed crystal has a truncated pyramid shape, and when a top end surface of the truncated pyramid is parallel to the {0001} plane, {0001}-plane uppermost portion refers to the top end surface of the truncated pyramid. On the other hand, when the top end surface of the truncated pyramid is inclined with respect to the {0001} plane, {0001}-plane uppermost portion refers to a {0001} plane that exists at the highest position of the top end surface of the truncated pyramid.

A term offset angle C of a plane (offset angle $C_k$ of a k-th plane) refers to an angle defined by a normal to the plane (k-th plane) and a normal to the {0001} plane.

A term offset downstream direction of a k-th plane refers to a direction that is perpendicular to an intersection line between the k-th plane and the {0001} plane, and goes from the {0001}-plane uppermost portion toward an offset downstream side.

A term k-th ridge line (k=1, 2, ..., (n−1)) refers to an intersection line between a k-th plane and a (k+1)-th plane. A term n-th ridge line refers to an intersection line between an n-th plane and a first plane.

2. SEED CRYSTAL FOR SiC SINGLE-CRYSTAL GROWTH

The seed crystal for SiC single-crystal growth (hereinafter, also simply referred to as seed crystal) according to the present invention has the following configuration.

(1) The seed crystal for SiC single-crystal growth includes a facet formation region containing the {0001}-plane uppermost portion, and n (n>=3) planes provided enclosing the periphery of the facet formation region.

(2) The facet formation region includes a region ranging from the center of gravity of the {0001}-plane uppermost portion to any point corresponding to a radius r being R/5 (R is a diameter of a circumscribed circle of the seed crystal for SiC single-crystal growth).

(3) The seed crystal for SiC single-crystal growth satisfies the relationships represented by formulas (a) to (c):

$$B^k_{k-1} <= \cos^-(\sin(2.3 \text{ degrees})/\sin C_k) \quad (a);$$

$$B^k_k <= \cos^-(\sin(2.3 \text{ degrees})/\sin C_k) \quad (b); \text{ and}$$

$$\min(C_k) <= 20 \text{ degrees} \quad (c),$$

where $C_k$ is an offset angle of a k-th plane,
$B^k_{k-1}$ is an angle defined by an offset downstream direction of the k-th plane and a (k−1)-th ridge line, and
$B^k_k$ is an angle defined by the offset downstream direction of the k-th plane and a k-th ridge line.

(2.1 Material, Offset Angle, and Size of Seed Crystal)

The seed crystal for SiC single-crystal growth according to the present invention is cut out from an SiC single crystal manufactured by any of various processes.

The SiC single crystal from which the seed crystal is cut out may be either (a) an SiC single crystal grown with a growth plane being a plane having an offset angle of 60 to 90 degrees from the {0001} plane (so-called a-plane grown crystal), or (b) an SiC single crystal grown with a growth plane being a plane having an offset angle of less than 60 degrees from the {0001} plane (so-called c-plane grown crystal). In particular, the seed crystal cut from the a-plane grown crystal has a low screw dislocation density, and is therefore preferred as the seed crystal for manufacturing a high-quality single crystal.

The seed crystal for SiC single-crystal growth according to the present invention is a seed crystal for so-called c-plane growth.

The seed crystal according to the present invention may include either (a) an offset substrate in which an angle defined by the bottom and the {0001} plane of the seed crystal is 0.5 to 30 degrees, or (b) an onset substrate in which an angle defined by the bottom and the {0001} plane of the seed crystal is less than 0.5 degrees.

The seed crystal may have any size without limitation. The invention, however, is particularly preferred for a seed crystal having a large diameter. Specifically, the invention is preferred for a seed crystal having a size (diameter of a circumscribed circle) of 100 mm or more. When the invention is applied to the seed crystal having a large diameter, formation of the linear c-plane facet is suppressed on the ridge line, the thickness of the seed crystal can be decreased, and the area of the main growth plane (a plane having the largest area among the n planes) can be increased.

(2.2 {0001}-Plane Uppermost Portion)

The {0001}-plane uppermost portion may be formed in the center of the seed crystal or in the neighborhood of an end of the seed crystal. When the {0001}-plane uppermost portion is formed in the neighborhood of the end of the seed crystal, the c-plane facet is formed at the end of the single crystal; hence, crystal growth mostly occurs on one large plane, and crystal orientations are thus easily aligned to one another. As a result, a wafer having a large-area high-quality region can be cut out from the resultant single crystal.

Here, neighborhood of an end refers to a region ranging from 0.6L to L (L is a distance from the center of gravity to the end of the seed crystal) with respect to the center of gravity of the seed crystal.

The position of the {0001}-plane uppermost portion corresponds to a position of an intersection formed by the planes.

(2.3 Facet Formation Region)

A term facet formation region refers to a region that contains the {0001}-plane uppermost portion inside thereof, and ranges from the center of gravity of the {0001}-plane uppermost portion to any point corresponding to a radius r being R/5 (R is a diameter of a circumscribed circle of the seed crystal for SiC single-crystal growth). A smaller facet formation region is more preferred, and r is preferably equal to R/8, and more preferably equal to R/10. While the periphery (outer side) of the facet formation region is enclosed by n (n>=3) planes nonparallel to one another as described later, the facet formation region may have any internal shape without limitation. The reason for this is as follows: since a facet has a certain size (about 1/10 to 1/5 of the diameter of the single crystal) in the process of crystal growth, a screw dislocation formation region covering such a size is preferably provided. Hence, the c-plane facet is permitted to be formed within the facet formation region.

For example, as illustrated in FIG. 1, the n planes may be directly extended into the facet formation region so as to form a pyramid shape. In this case, formation of the facet is more limited in the initial stage of crystal growth, and thus further high-quality SiC single crystal can be yielded. Alternatively, although not shown, the offset angle C of each of the n planes may be varied after the plane enters the facet formation region. The seed crystal having a truncated pyramid shape is an exemplary case of the latter.

(2.4 Plane)

The n (n>=3) planes are provided enclosing the periphery of the facet formation region. The planes are nonparallel to one another, and each plane configures a side face of the pyramid in the neighborhood of the {0001}-plane uppermost portion. A growth plane of the seed crystal is configured of the facet formation region and the n planes.

The number of the planes should be three or more. An increase in number of planes more than necessary, however, causes no benefit and an increase in processing cost. Hence, the number of planes is preferably 10 or less. The number of planes is more preferably 8 or less, and most preferably 6 or less.

(2.5 Formula (a) and Formula (b))

The seed crystal for SiC single-crystal growth according to the present invention satisfies the relationships represented by the formulas (a) and (b). In the formulas, the formula (a) represents a condition that no c-plane facet is formed on the (k−1)-th ridge line, i.e., a condition that an angle (hereinafter, referred to as $A_{k-1}$) defined by the (k−1)-th ridge line and the {0001} plane is 2.3 degrees or more.

Similarly, the formula (b) represents a condition that no c-plane facet is formed on the k-th ridge line, i.e., a condition that an angle (hereinafter, referred to as $A_k$) defined by the k-th ridge line and the {0001} plane is 2.3 degrees or more.

There is a relationship of $B^k_{k-1} = \cos^{-1}(\sin A_{k-1}/\sin C_k)$ between $B^k_{k-1}$, $C_k$, and $A_{k-1}$. Similarly, there is a relationship of $B^k_k = \cos^{-1}(\sin A_k/\sin C_k)$ between $B^k_k$, $C_k$, and $A_k$.

Hence, $A^k_{k-1} \geq 2.3$ degrees and $A^k_k \geq 2.3$ degrees should be satisfied in order to suppress formation of the c-plane facet on the ridge line. In other words, $B^k_{k-1}$ and $B^k_k$ should satisfy the formulas (a) and (b), respectively.

Figure 2:
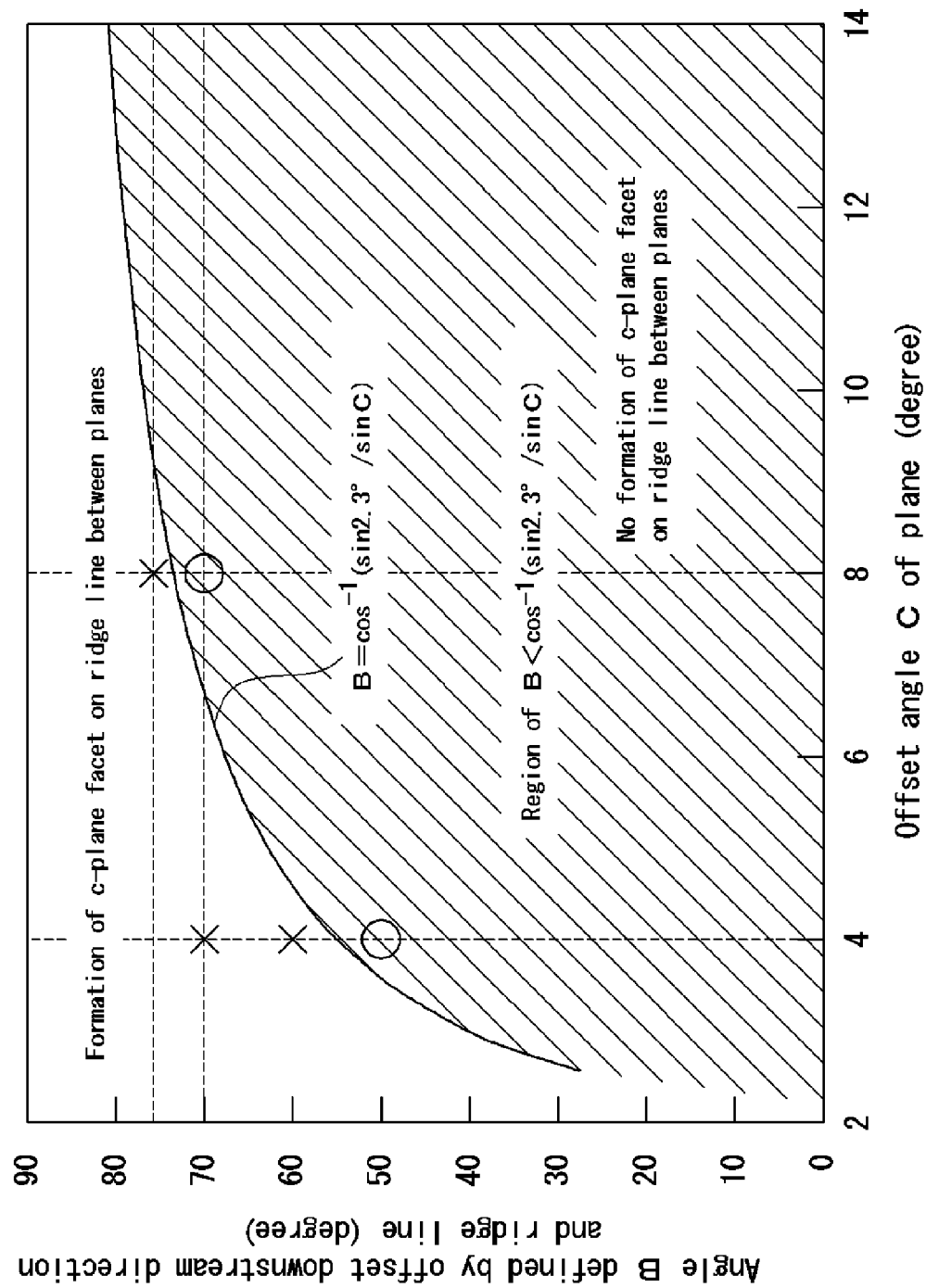
FIG. 2 is a diagram illustrating a relationship between an offset angle C of a plane and an angle B defined by an offset downstream direction and a ridge line.

FIG. 2 illustrates a relationship between an offset angle C of a plane and an angle B defined by an offset downstream direction and a ridge line. In FIG. 2, no c-plane facet is formed on the ridge line between the planes on a function $B = \cos^{-1}(\sin(2.3 \text{ degrees})/\sin C)$ and in a region below the function. On the other hand, the c-plane facet is formed on the ridge line in a region above the function $B = \cos^{-1}(\sin(2.3 \text{ degrees})/\sin C)$. FIG. 2 suggests that B must be decreased with a decrease in offset angle C of each plane forming the {0001}-plane uppermost portion.

(2.6 Formula (c))

The seed crystal for SiC single-crystal growth according to the present invention further satisfies the relationship represented by the formula (c). The formula (c) shows that the minimum value of the offset angle $C_k$ of any of the k-th planes (k=1, 2, . . . , n) should be 20 degrees or less. If the formula (c) is satisfied, a screw dislocation inherited from a screw dislocation formable region described later to a grown crystal is less likely to be converted into a stacking fault. As a result, formation of heterogeneous polytypes can be suppressed. Some of the n planes may each have an offset angle C of more than 20 degrees.

The offset angles C of the individual planes may be equal to or different from one another as long as the formula (c) is satisfied. At least one of the n planes, however, preferably has an offset angle C different from that of any of other planes.

When the formulas (a) to (c) are satisfied, and when the offset angles C of the individual planes are unequal to one another, at least one of the following effects is given depending on a shape, size, an offset angle, etc. of the seed crystal.

(a) The seed crystal having a large diameter may also have a small thickness.

(b) A main growth plane may have large area. In other words, a single crystal, which has a large proportion of a high-quality region in a grown crystal as a whole, can be manufactured.

(c) The {0001}-plane uppermost portion can be moved to the end of the seed crystal. In other words, a wafer having a large-area high-quality region can be cut out from the resultant single crystal.

Any of the k-th planes (k=1, 2, . . . , n) preferably has an offset angle $C_k$ of 8 degrees or less. The offset angle C of 8 degrees or less is substantially the same as an offset angle of a generally used wafer. Hence, when any of the planes has the offset angle C of 8 degrees or less, wafers are taken from the grown single crystal at a high yield. Moreover, thickness of the seed crystal can be decreased.

The k-th plane having a largest area (main growth plane) among the n planes preferably has an offset angle $C_k$ of 4 degrees or less. The offset angle C of 4 degrees or less is the same as an offset angle of a most generally distributed wafer; hence, a production yield is further increased, and thickness of the seed crystal can be further decreased.

(2.7 Screw Dislocation Formable Region)

A term screw dislocation formable region refers to a region that can supply screw dislocations into a grown crystal at a high density compared with a density in any of other regions. A specific screw dislocation formable region includes (a) a region having a high screw dislocation density partially existing in the seed crystal, (b) a region in which a screw dislocation supply source (for example, mechanical strain formed in the surface of the seed crystal) is formed in a surface of a seed crystal having a low screw dislocation density, and (c) one screw dislocation existing in the seed crystal.

In the case where the seed crystal contains a relatively large amount of screw dislocations, since the screw dislocations are supplied into the c-plane facet, heterogeneous polytypes are less likely to be formed. In such a case, the screw dislocation formable region may not be formed in the seed crystal.

On the other hand, in the case where the seed crystal contains a relatively small amount of screw dislocations, since the screw dislocations are insufficiently supplied into the c-plane facet, the heterogeneous polytypes are readily formed. In such a case, the screw dislocation formable region is preferably formed in the neighborhood of the {0001}-plane uppermost portion in order to manufacture a high-quality single crystal.

Here, the neighborhood of the {0001}-plane uppermost portion refers to a region ranging from the center of gravity of the {0001}-plane uppermost portion to any point corresponding to a radius r being R/5 (R is a diameter of a circumscribed circle of the seed crystal for SiC single-crystal growth).

As long as a sufficient amount of screw dislocations are supplied into the c-plane facet, the screw dislocation formable region may not correspond to a position of the {0001}-plane uppermost portion, and may be formed in the periphery of the {0001}-plane uppermost portion.

On the other hand, in the case where the {0001}-plane uppermost portion is a dotted portion (i.e., in the case where the top end of the seed crystal has a pyramid shape), the {0001}-plane uppermost portion preferably corresponds to a position of a screw dislocation within the seed crystal for SiC single-crystal growth. In this case, the screw dislocation formable region may supply one screw dislocation from the apex of the pyramid, or may supply not only one screw dislocation from the apex but also a plurality of screw dislocations from the periphery of the apex of the pyramid. When the apex of the pyramid corresponds to the position of the screw dislocation, the screw dislocation can be securely supplied into the c-plane facet.

For example, such a seed crystal can be manufactured by identifying a position of a screw dislocation contained in a single crystal by X-ray topography, and processing the single crystal such that the screw dislocation in the single crystal is situated at the apex of the pyramid.

3. METHOD OF MANUFACTURING SiC SINGLE CRYSTAL

The method of manufacturing the SiC single crystal according to the present invention includes a growth step of growing an SiC single crystal on a growth plane of the seed crystal for SiC single-crystal growth according to the invention.

A growth process of the SiC single crystal includes a sublimation-reprecipitation process, a CVD process, and a solution process. Any of the processes may be used in the invention. Details of the seed crystal for SiC single-crystal growth are as described above, and duplicated description is omitted.

4. SiC SINGLE CRYSTAL

Figure 5:
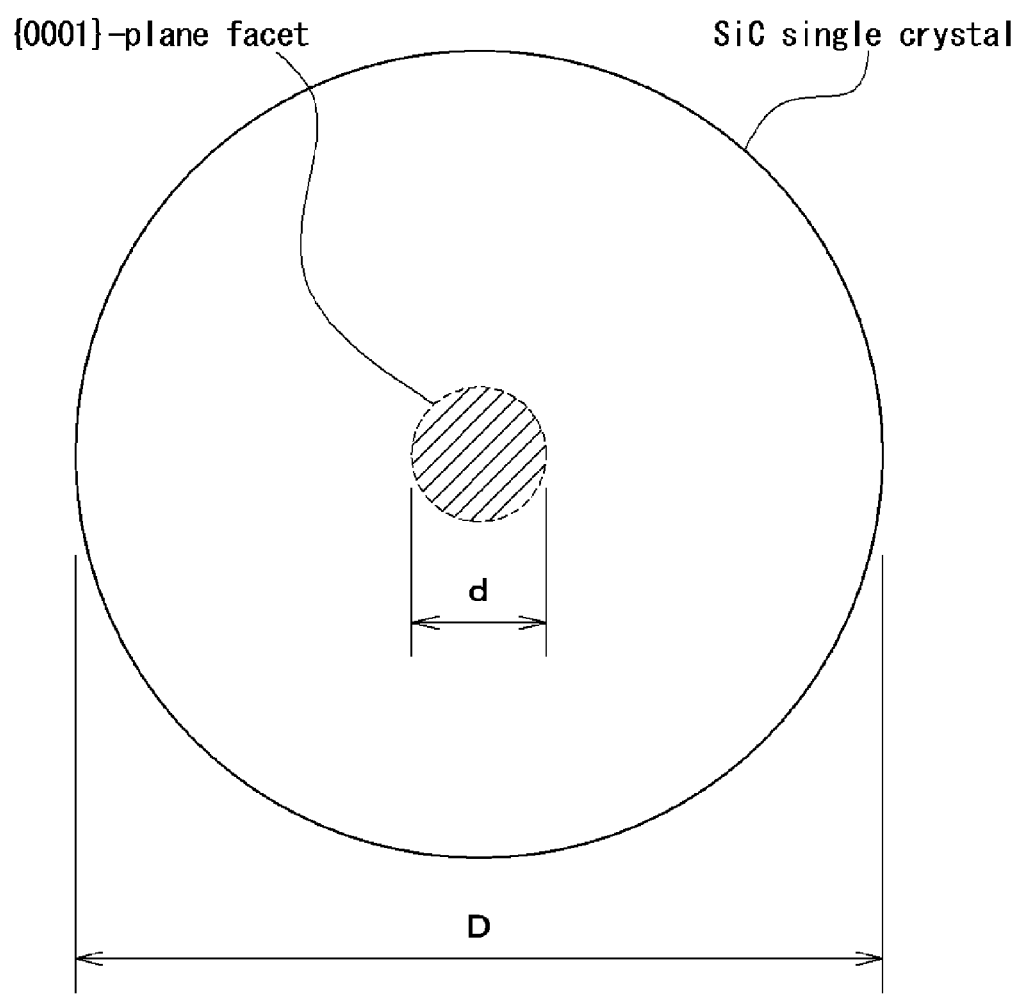
FIG. 5 is a schematic diagram of a cross-section of a grown crystal (SiC single crystal) sliced at a position directly on the seed crystal.

The SiC single crystal according to the present invention is characterized in that a maximum dimension (d) of a {0001}-plane facet in an initial stage of crystal growth (at a position slightly inside a grown crystal from an interface between the seed crystal for SiC single-crystal growth and a grown crystal) is ⅕ or less of a diameter (D) of the grown crystal in the initial stage of crystal growth, and the diameter (D) is 4 inches (101.6 mm) or more (see FIG. 5). Here, diameter (D) of the grown crystal refers to a diameter of a circumscribed circle of the grown crystal (SiC single crystal). An SiC single crystal satisfying such a condition is produced through use of the seed crystal for SiC single-crystal growth according to the invention. An SiC single crystal with $d<=D/8$ or $d<=D/10$ is given through optimization of the shape of the seed crystal.

5. EFFECTS

Through many experimental results, we have discovered the following. That is, the c-plane facet is formed, on a growth plane of the seed crystal, not only on the crystallographic {0001}-plane uppermost portion but also on a region of a growth plane defining an angle of less than 2.3 degrees with the {0001} plane. This causes formation of a c-plane facet having an unstable (linear) shape.

In the case where the neighborhood of the {0001}-plane uppermost portion is enclosed by n (n>=3) planes, the angle $A_k$ defined by the k-th ridge line formed between the planes and the {0001} plane is smaller than the angle $C_k$ defined by the k-th plane and the {0001} plane. Hence, even if the crystallographic {0001}-plane uppermost portion is formed by a plurality of planes to limit a formation position of the c-plane facet, a linear c-plane facet is formed on the k-th ridge line if $A_k$ is less than 2.3 degrees. As a result, heterogeneous polytypes are also readily formed.

Consequently, if each plane is formed such that the angle $A_k$ defined by the k-th ridge line and the {0001} plane is 2.3 degrees or more, formation of the c-plane facet on a ridge line can be suppressed.

It is, however, generally not easy to allow $A_k$ to have a certain value or more in formation of the surface shape of the seed crystal. In particular, in the case where a seed crystal having a large diameter is manufactured, $C_k$ cannot be excessively increased due to a restriction of the thickness of the seed crystal. It is therefore extremely difficult to form the surface shape of the seed crystal having a large diameter such that $A_k$ has a certain value or more.

Thus, an offset angle C and an offset downstream direction of the {0001} plane with respect to the surface of the seed crystal are beforehand measured by X-ray diffraction to determine an allowable range (an angular range of B causing $A_k$ of 2.3 degrees or more) of the angle B defining a ridge line with respect to the offset downstream direction. Subsequently, another plane is formed using the determined angle B. Use of such a technique allows easy determination of a surface shape of the seed crystal, the surface shape causing $A_k$ to have a certain value or more, even if the seed crystal has a large diameter and is thus limited in thickness.

Furthermore, as long as the formulas (a) to (c) are satisfied, area of the k-th plane (i.e., $B^k_{k-1}$ and $B^k_k$) can be increased. Consequently, a high-quality single crystal can be grown on a k-th plane having large area.

EXAMPLES

Example 1 and Comparative Example 1

Figure 3:
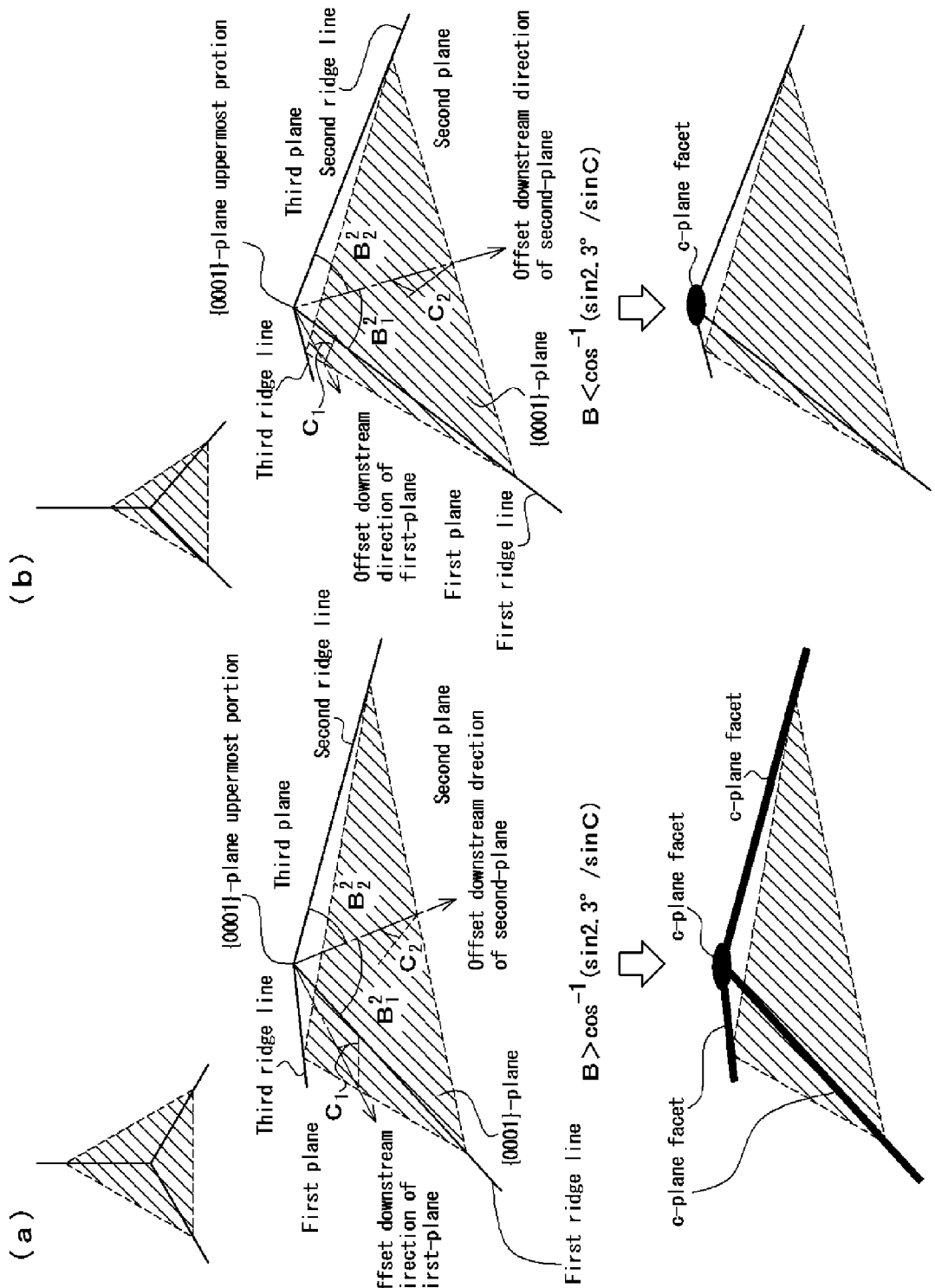
FIG. 3(a) is a schematic diagram of a seed crystal (Comparative Example 1) that does not satisfy the formulas (a) to (c).
FIG. 3(b) is a schematic diagram of a seed crystal (Example 1) that satisfies the formulas (a) to (c).

FIG. 3(a) illustrates a schematic diagram of a seed crystal (Comparative Example 1) that does not satisfy the formulas (a) to (c). FIG. 3(b) illustrates a schematic diagram of a seed crystal (Example 1) that satisfies the formulas (a) to (c).

In the seed crystal (Comparative Example 1) illustrated in FIG. 3(a), the {0001}-plane uppermost portion is configured of three planes. The offset angle C of each plane is slightly larger than 2.3 degrees. In this case, the c-plane facet is not formed on each plane. However, the angle ($A_k$) defined by each k-th ridge line and the {0001} plane is less than 2.3 degrees; hence, the c-plane facet is formed on the k-th ridge line.

As a result, in the case where single crystal growth is performed using the seed crystal having such a shape, and when screw dislocations do not sufficiently exist on the k-th ridge line, heterogeneous polytypes are formed. In addition, a screw dislocation formable region must be provided over a wide region containing each k-th ridge line in order to suppress the heterogeneous polytypes, leading to easy degradation in crystal quality.

In the seed crystal (Example 1) illustrated in FIG. 3(b), the {0001}-plane uppermost portion is configured of three planes as with Comparative Example 1. Differences between Example 1 and Comparative Example 1 are as follows.

(1) The offset angles C of the individual planes are unequal to one another.

(2) The offset angle $C_2$ of the second plane is slightly larger than 2.3 degrees. Each of the offset angle $C_1$ of the first plane and the offset angle $C_3$ of the third plane is set to be larger than $C_2$ such that the formulas (a) and (b) are satisfied.

(3) The respective $B^2_1$ and $B^2_2$ in the Example 1 are smaller than those in Comparative Example 1 such that the formulas (a) and (b) are satisfied on the second plane. In this way, formation of the c-plane facet on the k-th ridge line was able to be suppressed through adjustment of C and B on each plane.

Example 2 and Comparative Example 2

Figure 4:
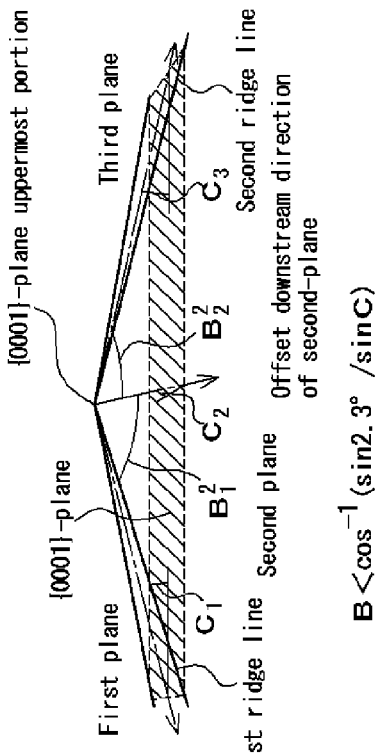
FIG. 4(a) is a schematic diagram of a seed crystal (Comparative Example 2) that does not satisfy the formulas (a) to (c).
FIG. 4(b) is a schematic diagram of a seed crystal (Example 2) that satisfies the formulas (a) to (c).
Figure 4:
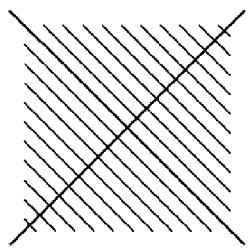
Figure 4:
Figure 4:
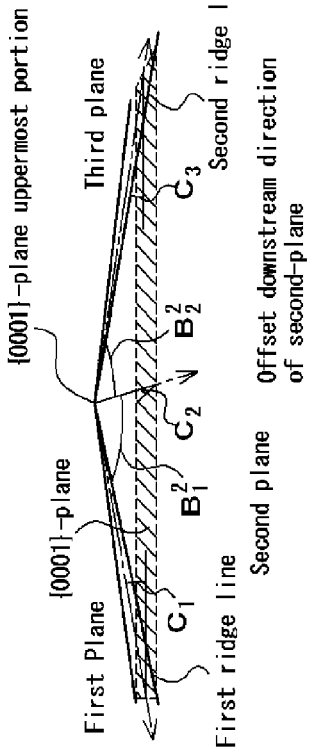
Figure 4:
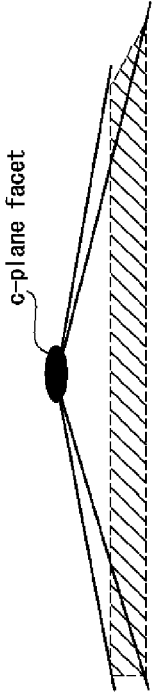
Figure 4:
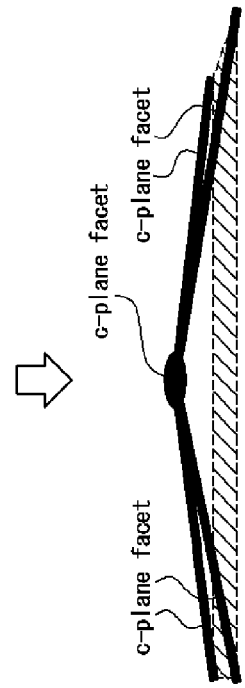

FIG. 4(a) illustrates a schematic diagram of a seed crystal (Comparative Example 2) that does not satisfy the formulas (a) to (c). FIG. 4(b) illustrates a schematic diagram of a seed crystal (Example 2) that satisfies the formulas (a) to (c).

In the seed crystal (Comparative Example 2) illustrated in FIG. 4(a), the {0001}-plane uppermost portion is configured of four planes. The offset angle C of each plane is slightly larger than 2.3 degrees. In this case, no c-plane facet is formed on each plane. However, the angle ($A_k$) defined by each k-th ridge line and the {0001} plane is less than 2.3 degrees; hence, the c-plane facet is formed on the k-th ridge line.

As a result, in the case where single crystal growth is performed using the seed crystal having such a shape, and when screw dislocations do not sufficiently exist on the k-th ridge line, heterogeneous polytypes are formed. In addition, a screw dislocation formable region must be provided over a wide region containing each k-th ridge line in order to suppress the heterogeneous polytypes, leading to easy degradation in crystal quality.

In the seed crystal (Example 2) illustrated in FIG. 4(b), the {0001}-plane uppermost portion is configured of four planes as with Comparative Example 2. Differences between the Example 2 and Comparative Example 2 are as follows.

(1) The offset angle C of each plane is set larger than that in Comparative Example 2 such that the formulas (a) and (b) are satisfied.

In this way, formation of the c-plane facet on the k-th ridge line was able to be suppressed through adjustment of C and B on each plane.

INDUSTRIAL APPLICABILITY

The seed crystal for SiC single-crystal growth, the SiC single crystal, and the method of manufacturing the SiC single crystal according to the present invention can be used for manufacture of a semiconductor material for ultra-low-power-loss power devices.

The invention claimed is:

1. A seed crystal for SiC single-crystal growth, comprising:
   a facet formation region containing a {0001}-plane uppermost portion; and
   n (n>=3) planes enclosing the periphery of the facet formation region, wherein:
   the facet formation region includes a region ranging from the center of gravity of the {0001}-plane uppermost portion to any point corresponding to a radius r being R/5 where R is a diameter of a circumscribed circle of the seed crystal for SiC single-crystal growth;
   the seed crystal for SiC single-crystal growth satisfies the relationships represented by formulas (a) to (c), $$B^k_{k-1} <= \cos^{-1}(\sin(2.3 \text{ degrees})/\sin C_k) \quad (a),$$

$$B^k_k <= \cos^{-1}(\sin(2.3 \text{ degrees})/\sin C_k) \quad (b),$$

$$\min(C_k) <= 20 \text{ degrees} \quad (c),$$

where $C_k$ is an offset angle of a k-th plane, $B^k_{k-1}$ is an angle defined by an offset downstream direction of the k-th plane and a (k−1)-th ridge line, and $B^k_k$ is an angle defined by the offset downstream direction of the k-th plane and a k-th ridge line;
   by satisfying the relationships represented by formulas (a) and (b), an angle defined by the (k−1)-th ridge line and the {0001} plane is 2.3 degrees or more so that no c-plane facet is formed on the (k−1)-th ridge line and an angle defined by the k-th ridge line and the {0001} plane is 2.3 degrees or more so that no c-plane facet is formed on the k-th ridge line; and
   a diameter of the circumscribed circle of the seed crystal for SiC single-crystal growth is 100 mm or more.

2. The seed crystal for SiC single-crystal growth according to claim 1, wherein the seed crystal for SiC single-crystal growth is cut out from an SiC single crystal grown with a growth plane being a plane having an offset angle of 60 to 90 degrees from the {0001} plane.

3. The seed crystal for SiC single-crystal growth according to claim 1, further comprising a screw dislocation formable region that allows screw dislocations to be formed at a higher density in the neighborhood of the {0001}-plane uppermost portion than on an offset downstream side.

4. The seed crystal for SiC single-crystal growth according to claim 1, wherein the {0001}-plane uppermost portion is provided in the neighborhood of an end of the seed crystal for SiC single-crystal growth.

5. The seed crystal for SiC single-crystal growth according to claim 1, wherein at least one of the n planes has an offset angle C different from that of any of the other n planes.

6. The seed crystal for SiC single-crystal growth according to claim 1,
wherein the {0001}-plane uppermost portion is a dotted portion, and
the {0001}-plane uppermost portion corresponds to a position of a screw dislocation within the seed crystal for SiC single-crystal growth.

7. The seed crystal for SiC single-crystal growth according to claim 1, wherein any of the k-th planes (k=1, 2, n) has an offset angle $C_k$ of 8 degrees or less.

8. The seed crystal for SiC single-crystal growth according to claim 1, wherein a k-th plane having the largest area among the n planes has an offset angle $C_k$ of 4 degrees or less.

9. A method of manufacturing an SiC single crystal, comprising a growth step of growing an SiC single crystal on a growth plane of the seed crystal for SiC single-crystal growth according to claim 1.

10. An SiC single crystal, wherein a maximum dimension (d) of a {0001}-plane facet in an initial stage of crystal growth, at a position slightly inside a grown crystal from an interface between the seed crystal for SiC single-crystal growth and a grown crystal, is ⅕ or less of a diameter (D) of the grown crystal in the initial stage of crystal growth, and the diameter (D) is 4 inches (101.6 mm) or more.

* * * * *